(12) United States Patent
Lee

(10) Patent No.: US 8,202,436 B2
(45) Date of Patent: Jun. 19, 2012

(54) USE OF BLOCK COPOLYMERS FOR PREPARING CONDUCTIVE NANOSTRUCTURES

(75) Inventor: Kwangyeol Lee, Namyangju-si (KR)

(73) Assignee: Korea University Research and Business Foundation, Seoul (KR)

( * ) Notice: Subject to any disclaimer, the term of this patent is extended or adjusted under 35 U.S.C. 154(b) by 369 days.

(21) Appl. No.: 12/642,556

(22) Filed: Dec. 18, 2009

(65) Prior Publication Data

US 2011/0147337 A1    Jun. 23, 2011

(51) Int. Cl.
*H01B 13/00* (2006.01)
(52) U.S. Cl. ......... 216/13; 438/3; 257/E29.076; 257/14; 430/323
(58) Field of Classification Search .................... 216/13; 430/323; 257/14, E29.076; 438/3
See application file for complete search history.

(56) References Cited

U.S. PATENT DOCUMENTS

| | | | |
|---|---|---|---|
| 2008/0257187 A1* | 10/2008 | Millward | ...................... 101/452 |
| 2009/0087582 A1 | 4/2009 | Watanabe et al. | |
| 2010/0075116 A1 | 3/2010 | Russell et al. | |

FOREIGN PATENT DOCUMENTS

WO    WO 02/073699    9/2002

OTHER PUBLICATIONS

Glass, R. et al.—"Block Copolymer Micelle Nanolithography"—Nanotechnology, 2003, vol. 14,pp. 1153-1160.*
Glass, R. et al.—"Block Copolymer Micelle Nanolithography"—Nanotechnology, 2003, vol. 14, pp. 1153-1160.
Kim, B.J. et al.—"Nanoparticle-Induced Phase Transitions in Diblock-Copolymer Films"—Advanced Materials, 2005, vol. 17, pp. 2618-2622.
International Search Report and Written Opinion from International Application No. PCT/KR2010/008926 dated Mar. 22, 2011.
Ion Bita, et al "Graphoepitaxy of Self-Assembled Block Copolymers on Two-Dimensional Periodic Patterned Templates" Science, vol. 321, Aug. 15, 2008, pp. 939-943.
Ricardo Ruiz, et al "Density Multiplication and Improved Lithography by Directed Block Copolymer Assembly" Science, vol. 321, Aug. 15, 2008, pp. 936-939.
Anna C. Balazs, et al "Nanoparticle Polymer Composites: Where Two Small Worlds Meet" Science, vol. 314, Nov. 17, 2006, pp. 1107-1110.
Michael E. Mackay, et al "General Strategies for Nanoparticles Dispersion" Science, vol. 311, Mar. 24, 2006, pp. 1740-1743.
Sara E. Skrabalak, et al "On the Polyol Synthesis of Silver Nanostructures: Blycolaldehyde as a Reducing Agent" Nano Lett., vol. xx, No. xx, XXXX, published on the Web May 29, 2008, pp. A-E.

(Continued)

*Primary Examiner* — Nadine G Norton
*Assistant Examiner* — Mahmoud Dahimene
(74) *Attorney, Agent, or Firm* — Workman Nydegger

(57) ABSTRACT

Methods for preparing one or more conductive nanostructures are provided. In accordance with one embodiment, a method for preparing one or more conductive nanostructures may include providing a composite of nanoparticles and block copolymer including one or more first microdomains and one or more second microdomains, where conductive nanoparticles are selectively distributed in the one or more first microdomains, removing the first microdomains while leaving the conductive nanoparticles in the composite, forming one or more conductive nanostructures on the conductive nanoparticles, and removing the second microdomains.

25 Claims, 16 Drawing Sheets

OTHER PUBLICATIONS

Shuhong Liu, et al "Assembly and Alignment of Metallic Nanorods on Surfaces with Patterned Wettability" Small 2006, 2, No. 12, pp. 1448-1453 Journal.

Joseph M. McLellan, et al "Edge Spreading Lithography and Its Application to the Fabrication of Mesoscopic Gold and Silver Rings" J. Am. Chem. Soc., 2004, vol. 126, No. 35, pp. 10830-10831.

Xianmao Lu, et al "Ultrathin Gold Nanowires Can Be Obtained by Reducing Polymeric Strands of Oleylamine—AuCl Complexes Formed via Aurophilic Interaction" J. Am. Chem. Soc., 2008, vol. 130, No. 28, pp. 8900-8901.

Jinan Chai, et al "Assembly of alligned linear metallic patterns on silicon" Nature Nanotechnology, vol. 2, Aug. 2002, pp. 500-506.

So-Jung Park, et al "Array-Based Electrical Detection of DNA with Nanoparticle Probes" Science, vol. 295, Feb. 2002, pp. 1503-1506.

Eric P. Lee, et al "Growing Pt Nanowires as a Densely Packed Array on Metal Gauze" J. Am. Chem. Soc., vol. 129, No. 35, pp. 10634-10635.

* cited by examiner micelle  cylindrical micelle  vesicle face-centred cubic   body-centered cubic   hexagonal   gyroid lamellar structures Wire Mesh Aggregated
particles

USE OF BLOCK COPOLYMERS FOR PREPARING CONDUCTIVE NANOSTRUCTURES

TECHNICAL FIELD

The present disclosure generally relates to methods of preparing conductive nanostructures.

BACKGROUND

Nanoparticles can be selectively adhered to a pre-designed pattern to form micro- or nano-sized structures. Sizes, shapes, or materials of nanopatterns can determine the properties of a surface on which nanopatterns are formed. For example, antifouling, antireflective, sticking, non-sticking, or bio-compatible properties can be determined by nanopatterns. Also, throughput of nanopattern formation processes can be determined by sizes, shapes or materials of nanopatterns.

SUMMARY

Embodiments of methods for preparing conductive nanostructures are disclosed herein. In accordance with one embodiment by way of non-limiting example, a method for preparing one or more conductive nanostructures includes providing a composite of nanoparticles and block copolymer, the composite including one or more first microdomains and one or more second microdomains, where one or more conductive nanoparticles are selectively distributed in the one or more first microdomains, removing the first microdomains while leaving the conductive nanoparticles in the composite, forming one or more conductive nanostructures on the conductive nanoparticles, and removing the second microdomains.

In another embodiment, a method for preparing one or more conductive nanostructures includes preparing a conductive layer coated with a block copolymer, where the block copolymer includes one or more first microdomains and one or more second microdomains, removing the first microdomains of the block copolymer under conditions effective to expose parts of the conductive layer, etching the exposed parts of the conductive layer, and removing the second microdomains under conditions effective to prepare one or more conductive nanostructures.

Conductive nanostructures prepared by the above methods, as well as electronic circuits and electronic devices containing such conductive nanostructures, are also disclosed herein.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
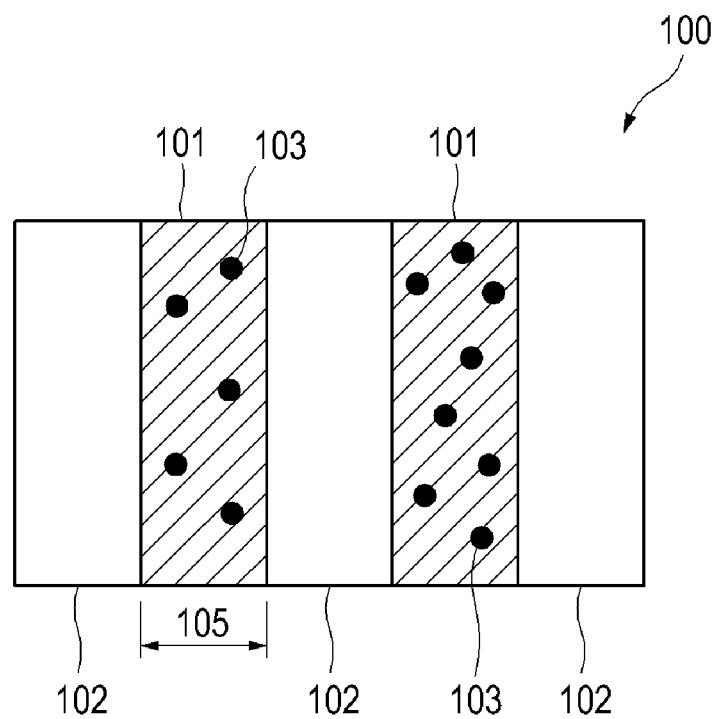
FIGS. 1A-1D are schematic diagrams showing an illustrative embodiment of a method for preparing conductive nanostructures.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Figure 1B:
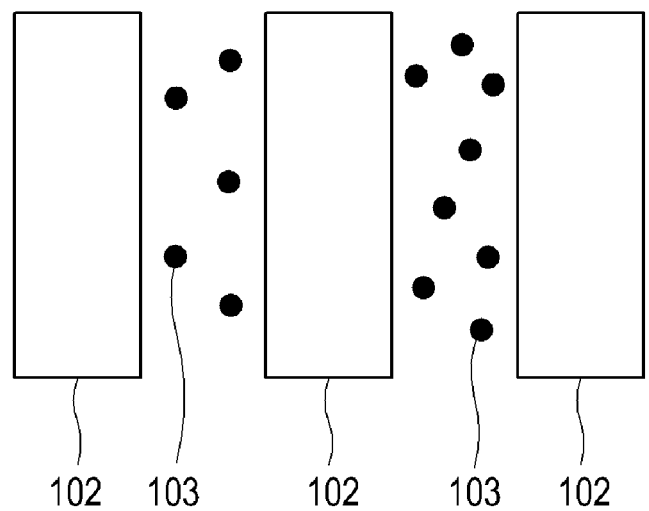
Figure 1C:
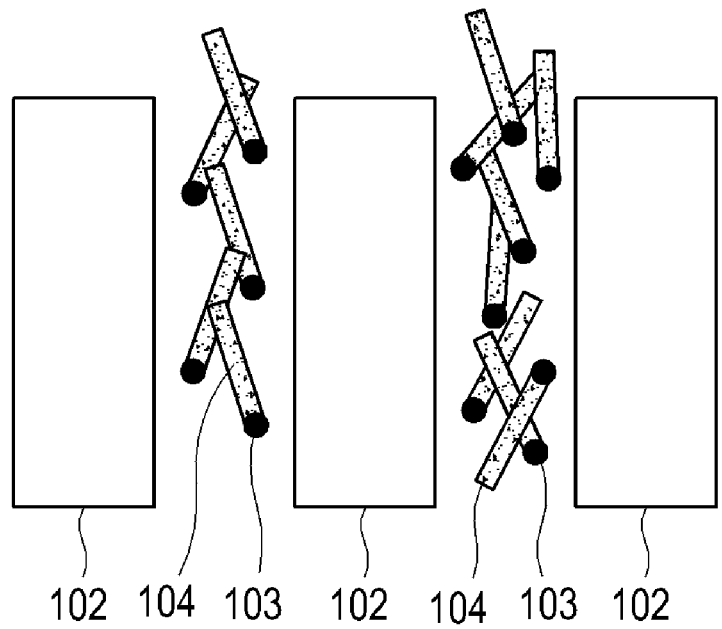
Figure 1D:
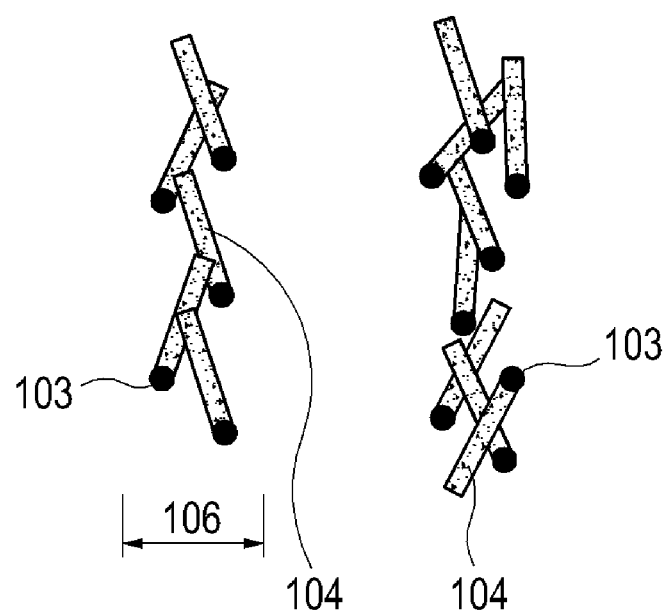

FIGS. 1A-1D are schematic diagrams showing an illustrative embodiment of a method for preparing one or more conductive nanostructures. FIG. 1A shows an illustrative example of a composite 100 of nanoparticle and block copolymer being provided. The composite 100 includes one or more first microdomains 101, one or more second microdomains 102, and one or more conductive nanoparticles 103 selectively distributed in the one or more first microdomains 101. The block copolymer may include a first segment and a second segment, which can undergo self-assembly and form one or more first microdomains 101 and second microdomains 102, respectively, which will be described hereinafter with respect to FIGS. 2A and 2B. Depending on the relative thickness of each block or microdomain, several morphologies can be obtained. For example, in diblock copolymers, sufficiently different microdomain thicknesses may lead to nanometer-sized spheres of one microdomain in a matrix of the second microdomain, whereas microdomains of similar thickness may form layers or a lamellar structure. Next, as illustrated in FIG. 1B, the first microdomains 101 may be removed, while leaving the conductive nanoparticles 103 in the composite 100. Then, one or more conductive nanostructures 104 may be formed on the conductive nanoparticles 103, as depicted in FIG. 1C. FIG. 1D shows an illustrative example of the one or more conductive nanostructures 104, after the second microdomains 102 are removed.

Figure 2A:
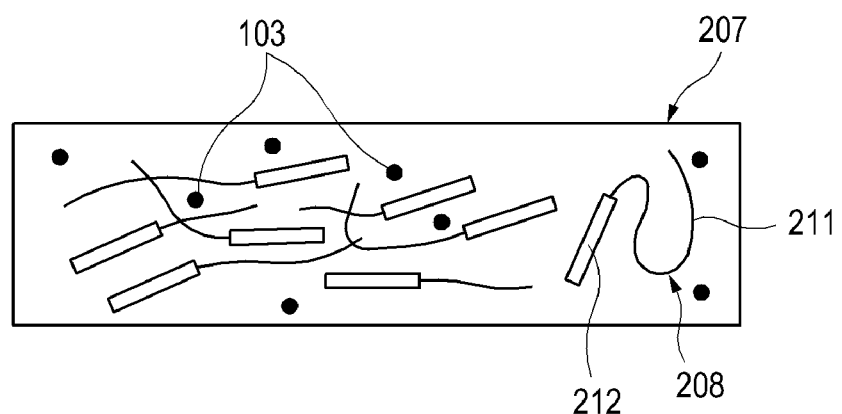
FIGS. 2A-2B are schematic diagrams showing an illustrative embodiment of preparing the composite of conductive nanoparticles and block copolymer shown in FIG. 1A.
Figure 2B:
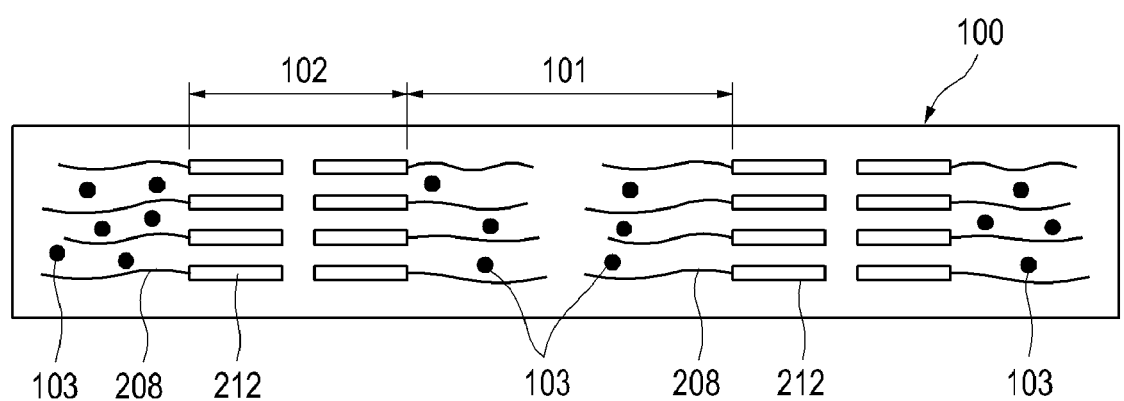

FIGS. 2A-2B are schematic diagrams showing an illustrative embodiment of preparing the composite 100 of conductive nanoparticles and block copolymer shown in FIG. 1A. In some embodiments, the composite 100 of conductive nanoparticles and block copolymer may be provided by mixing conductive nanoparticles 103 and a block copolymer 208. In some embodiments, the conductive nanoparticles 103 and the block copolymer 208 may be combined by methods such as, but not limited to, mechanical mixing, solution mixing, homogenization or sonication.

FIG. 2A illustrates a mixture 207 of conductive nanoparticles and a block copolymer where the conductive nanoparticles 103 are randomly distributed in the block copolymer 208. The conductive nanoparticles 103 may include, without limitation, a metal, a metal-coated inorganic material, and a metal-coated polymer. The metal may be, but is not limited to, one or more of Ag, Fe, Co, Ni, Au, Pt, Ru, and Pd. In some embodiments, the conductive nanoparticles 103 may be surface functionalized. For example, functional small molecules and polymers can be attached to conductive nanoparticles 103 by physical adsorption or covalent attachment to impart affinity to a certain chemical entity. The functional small molecules may be, but are not limited to, one or more of thiol-terminated alkyl and hydroxyl-terminated alkyl. The polymers may be, but are not limited to, one or more of poly(ethylene glycol) and polystyrene.

The size of the conductive nanoparticles 103 may be less than the radius of gyration of the block copolymer 208, so that the conductive nanoparticles 103 can be well distributed within the one or more first microdomains 101 of the block copolymer 208. In some embodiments, the size of the conductive nanoparticles 103 may range from about 2 nm to about 20 nm, from about 2 nm to about 10 nm, from about 2 nm to about 5 nm, from about 2 nm to about 4 nm, from about 4 nm to about 20 nm, from about 5 nm to about 20 nm, from about 10 nm to about 20 nm, from about 2 nm to about 4 nm, from about 4 nm to about 5 nm, or from about 5 nm to about 10 nm. In other embodiments, the size of the conductive nanoparticles 103 may be about 2 nm, about 4 nm, about 5 nm, about 10 nm, or about 20 nm.

The block copolymer 208 may be, without limitation, one or more of polystyrene-b-poly(2-vinylpyridine) (PS-b-P2VP), polystyrene-b-polydimethylsiloxane (PS-b-PDMS), polystyrene-b-poly(methyl methacrylate) (PS-b-PMMA), polystyrene-b-poly(n-hexyl methacrylate) (PS-b-PHMA), polystyrene-b-polyimide (PS-b-PI), polystyrene-b-polybutadiene (PS-b-PB), polystyrene-b-polybutadiene-b-polystyrene (PS-b-PB-b-PS), polystyrene-b-polyimide-b-polystyrene (PS-b-PI-b-PS), poly(methyltetracyclododecene)-b-poly(substituted-2-norbornene) (PMTCDD-b-P2NB), and lysine-b-cysteine.

The block copolymer 208 may include a first segment 211 and a second segment 212, which, after self-assembly, are to constitute one or more first microdomains 101 and second microdomains 102, respectively. In the mixture 207, the conductive nanoparticles 103 may selectively associate with the first segment 211 of the block copolymer 208 over the second segment 212, due to enthalpic effects such as, but not limited to, hydrophilicity, van der Waals interaction, and coordination affinity and/or entropic effects such as, but not limited to, steric hindrance. For example, if the conductive nanoparticles 103 have a specific affinity to hydrophilic groups and the first segment 211 of the block copolymer 208 contains hydrophilic groups, the conductive nanoparticles 103 may selectively associate with the first segment 211 of the block copolymer 208, resulting in a selective distribution of the conductive nanoparticles 103 in the one or more first microdomains 101. In some embodiments, "selective distribution" of the conductive nanoparticles 103 in the one or more first microdomains 101 may indicate from about 70% to about 100%, from about 80% to about 100%, from about 90% to about 100%, from about 95% to about 100%, from about 99% to about 100%, from about 70% to about 99%, from about 70% to about 95%, from about 70% to about 90%, from about 70% to about 80%, from about 80% to about 90%, from about 90% to about 95%, or from about 95% to about 99% of the total number of conductive nanoparticles 103 being distributed in the one or more first microdomains 101. In other embodiments, "selective distribution" of the conductive particles 103 in the one or more first microdomains 101 may indicate about 70%, about 80%, about 90%, about 95%, about 99% or 100% of the total number of conductive nanoparticles 103 being distributed in the one or more first microdomains 101.

FIG. 2B illustrates the composite 100 of conductive nanoparticles and block copolymer where the block copolymer 208 is self-assembled into one or more first microdomains 101 and one or more second microdomains 102. In some embodiments, self-assembly of the block copolymer 208 in the first and second microdomains 101 and 102 may be induced by methods such as, but not limited to, heating, UV radiation, or application of an electrical field. Detail on the self-assembly, see Balazs, et. al., Science 314, 1107 (2006), which is incorporated by reference herein in its entirety. In other embodiments, the block copolymer 208 may simply be allowed to stand at ambient conditions for a certain period of time.

The heating temperature can generally be determined by routine experimentation. By way of non-limiting example, the heating may be carried out at a temperature of from about 30° C. to about 150° C. In some embodiments, the temperature for the heat treatment may range from about 40° C. to about 150° C., from about 50° C. to about 150° C., from about 75° C. to about 150° C., from about 100° C. to about 150° C., from about 125° C. to about 150° C., from about 30° C. to about 125° C., from about 30° C. to about 100° C., from about 30° C. to about 75° C., from about 30° C. to about 50° C., from about 30° C. to about 40° C., from about 40° C. to about 50° C., from about 50° C. to about 75° C., from about 75° C. to about 100° C., or from about 100° C. to about 125° C. In other embodiments, the temperature for the heat treatment may be about 30° C., about 40° C., about 50° C., about 75° C., about 100° C., about 125° C., or about 150° C.

The heating may be carried out for, for example, from about 1 minute to 10 hours. In some embodiments, the time for the heat treatment may range from about 5 minutes to about 10 hours, from about 10 minutes to about 10 hours, from about 20 minutes to about 10 hours, from about 40 minutes to about 10 hours, from about 1 hour to about 10 hours, from about 2 hours to about 10 hours, from about 4 hours to about 10 hours, from about 6 hours to about 10 hours, from about 8 hours to about 10 hours, from about 1 minute to about 5 minutes, from about 1 minute to about 10 minutes, from about 1 minute to about 20 minutes, from about 1 minute to about 40 minutes, from about 1 minute to about 1 hour, from about 1 minute to about 2 hours, from about 1 minute to about 4 hours, from about 1 minute to about 6 hours, from about 1 minute to about 8 hours, from about 5 minutes to about 10 minutes, from about 10 minutes to about 20 minutes, from about 20 minutes to about 40 minutes, from about 40 minutes to about 1 hour, from about 1 hour to about 2 hours, from about 2 hours to about 4 hours, from about 4 hours to about 6 hours, or from about 6 hours to about 8 hours. In other embodiments, the time for the heat treatment may be about 1 minute, about 5 minutes, about 10 minutes, about 20 minutes, about 40 minutes, about 1 hour, about 2 hours, about 4 hours, about 6 hours, about 8 hours, or about 10 hours.

Figure 3A:
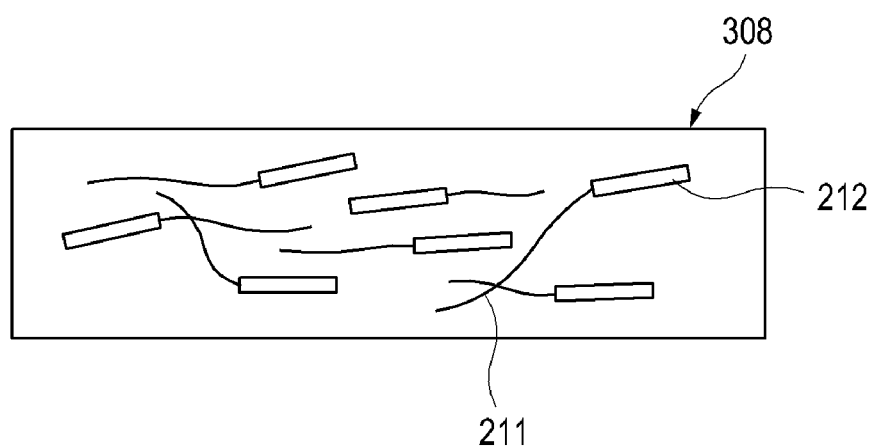
FIGS. 3A-3C are schematic diagrams showing another illustrative embodiment of preparing the composite of conductive nanoparticles and block copolymer shown in FIG. 1A.
Figure 3B:
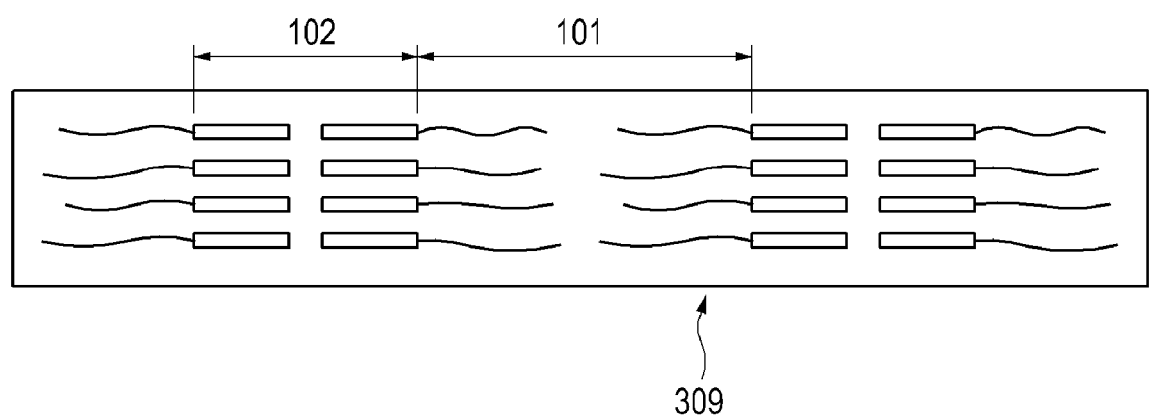
Figure 3C:
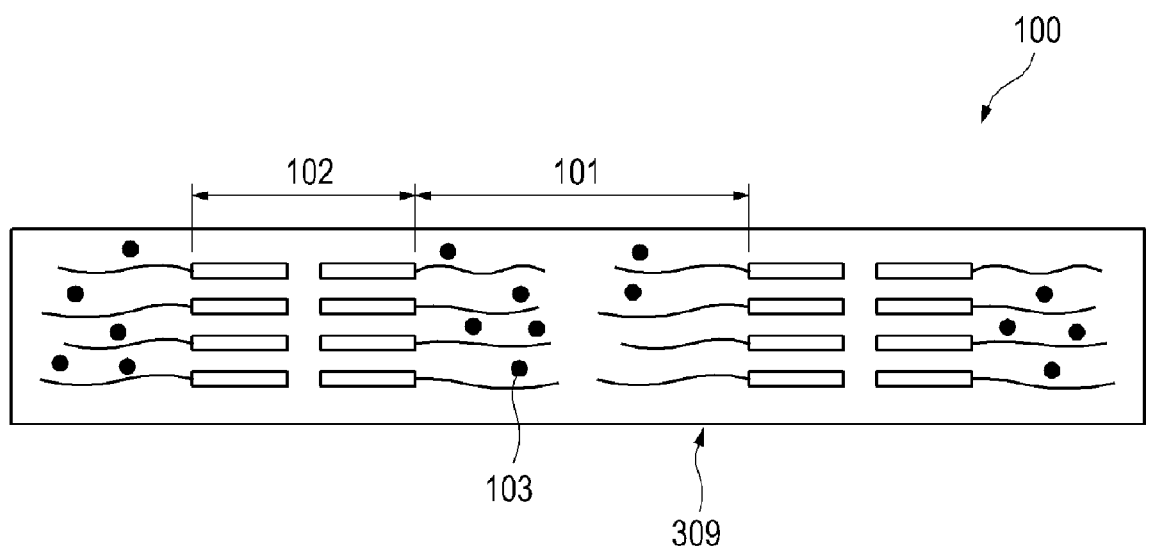

FIGS. 3A-3C are schematic diagrams showing another illustrative embodiment of preparing the composite 100 of conductive nanoparticles and block copolymer shown in FIG. 1A. In some embodiments, the composite 100 of nanoparticles and block copolymer may be provided by providing a block copolymer 308 (FIG. 3A), forming a self-assembled block copolymer 309 (FIG. 3B) by inducing self-assembly of the block copolymer 308 into the first microdomains 101 and the second microdomains 102, and then adding conductive nanoparticles 103 to the self-assembled copolymer 309 (FIG. 3C) such that the conductive nanoparticles 103 can be selectively distributed in the first microdomains 101.

In some embodiments, when providing the composite 100 of nanoparticles and block copolymer, the mixture 207 of conductive nanoparticles 103 and block copolymer 208 may be deposited on a substrate, prior to the inducing self-assembly of the block copolymer. The substrate may be made of a variety of materials including, but not limited to, a glass, $SiO_2$, and a combination thereof. In some embodiments, the glass may include, but is not limited to, one or more of soda-lime glass, quartz glass, borosilicate glass, acrylic glass, sugar glass, isinglass, aluminum oxynitride, and the like. The mixture 207 may be deposited on the substrate by methods such as, but not limited to, spin coating and solvent casting.

Figure 4:
FIG. 4 depicts various illustrative embodiments of a self-assembled block copolymer having different shapes.
Figure 4:
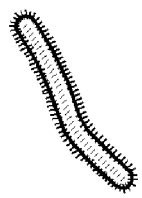
Figure 4:
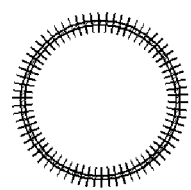
Figure 4:
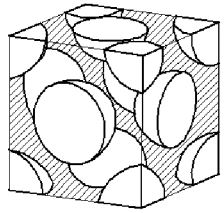
Figure 4:
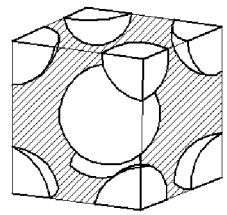
Figure 4:
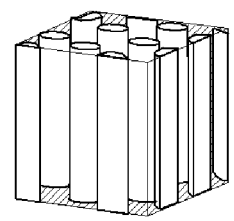
Figure 4:
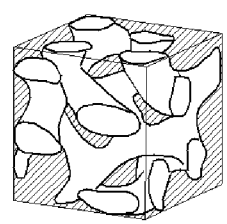
Figure 4:
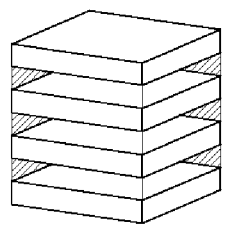
Figure 4:
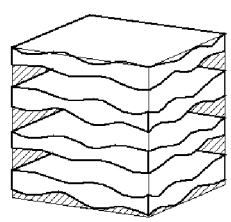
Figure 4:
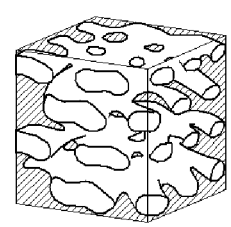

FIG. 4 depicts various illustrative embodiments of the self-assembled block copolymer having different shapes. For example, the block copolymers may be self-assembled such that the first microdomains and the second microdomains of the composite are configured in a predetermined pattern, including a variety of patterns in different sizes and shapes, such as micelle, cylindrical micelle, vesicle, face-centered cubic, body-centered cubic, hexagonal, gyroid or lamellar structures (e.g., with alternating first and second microdomains), but are not limited thereto.

Referring back to FIGS. 1A-1D, the one or more first microdomains 101 of the composite 100 of nanoparticle and block copolymer may have, without limitation, a thickness 105 of from about 5 nm to about 50 nm. The thickness 105 of the one or more first microdomains 101 may be the same as or larger than the width 106 of the conductive nanostructures 104. In some embodiments, the thickness 105 of the one or more first microdomains 101 may range from about 7 nm to about 50 nm, from about 10 nm to about 50 nm, from about 20 nm to about 50 nm, from about 30 nm to about 50 nm, from about 5 nm to about 7 nm, from about 5 nm to about 10 nm, from about 5 nm to about 20 nm, from about 5 nm to about 30 nm, from about 7 nm to about 10 nm, from about 10 nm to about 20 nm, or from about 20 nm to about 30 nm. In other embodiments, the thickness 105 of the one or more first microdomains 101 may be about 5 nm, about 7 nm, about 10 nm, about 20 nm, about 30 nm, or about 50 nm.

Referring back to FIG. 1B, the first microdomains 101 may be removed while leaving the conductive nanoparticles 103 in the composite 100 of nanoparticles and block copolymer. In particular, the association or bond between the conductive nanoparticles 103 and the first segment 211 of the block copolymer 208 is relatively week due to hydrophilicity, van der Waals interaction, and coordination affinity and/or entropic effects, such that the first microdomains 101 can be easily removed by chemical/physical treatment while still leaving the conductive nanoparticles 103. By ways of examples, the first microdomains 101 may be removed by methods such as, but not limited to, chemical treatment, UV radiation, $O_3$ treatment, plasma treatment, and a combination thereof.

Next, one or more conductive nanostructures 104 may be formed on the conductive nanoparticles 103, as depicted in FIG. 1C. The one or more conductive nanostructures 104 may include, by way of non-limiting example, a metal. In some embodiments, the metal may include, without limitation, one or more of Ag, Fe, Co, Ni, Au, Pt, Ru, and Pd. The one or more conductive nanostructures 104 may be formed on the conductive nanoparticles 103 by using the conductive nanoparticles 103 as nucleation seeds by commonly known metal growth methods. For details on examples of the metal growth methods, see Lu et al., J. Am. Chem. Soc. 130, 8900-8901 (2008) and Park et al, Science 295, 1503-1506 (2002), which are incorporated by reference herein in their entirety. When the conductive nanostructures 104 form on the conductive nanoparticles 103, the one or more second microdomains 102 may act as a framework to direct the conductive nanostructures 104 to form in a generally uniform direction within the space between the one or more second microdomains 102, as illustrated in FIG. 1C.

Figure 5A:
FIGS. 5A-5C are schematic diagrams showing an illustrative embodiment of forming conductive nanostructures on conductive nanoparticles.
Figure 5B:
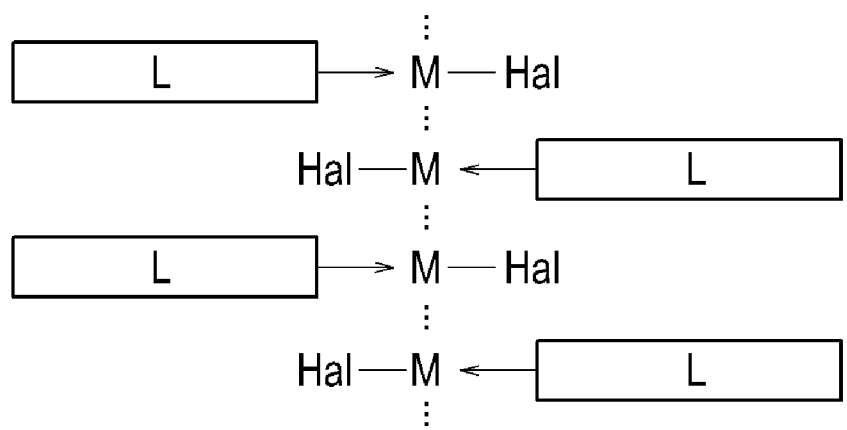
Figure 5C:
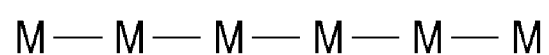

FIGS. 5A-5C are schematic diagrams showing an illustrative embodiment of forming the conductive nanostructures on the conductive nanoparticles, as shown in FIG. 1C. In some embodiments, the one or more conductive nanostructures 104 may be formed on the conductive nanoparticles 103 by reacting metal halide (M-Hal) and a coordinating ligand (L) under conditions effective to form organometallic complexes, as depicted in FIGS. 5A-5B. The metal halide may be, without limitation, a halide salt of a noble metal selected from the group consisting of Au, Pt, Pd, Ni, and Ag. In some embodiments, the metal halide may be, without limitation, AuCl, $HAuCl_4$ or $H_2PtCl_6$. The coordinating ligand may be, without limitation, an alkylamine, alkylcyanide, or alkylphosphine. In certain embodiments, the metal halide may be Au Cl and the coordinating ligand may be oleylamine. As illustrated in FIG. 5B, the metal-metal bonding of organometallic complexes formed from metal halides and coordinating ligands may lead to the formation of one-dimensional polymeric chains. Because of interactions such as van der Waals attraction between the coordinating ligands, the one-dimensional structure may form polymeric strands with backbones of metal ions surrounded by ligands, as depicted in FIG. 5B.

The one or more conductive nanostructures 104 may be formed by subjecting the organometallic complexes under conditions effective to convert metal ions in the organometallic complexes to metal atoms and generate metal nanostructures, as illustrated in FIG. 5C. The presence of conductive nanoparticles 103 may act as a catalyst to change the rate for the formation of metal atoms and promote the growth of metal nano structures. In some embodiments, the organometallic complexes may be subjected to reductive conditions such as, but not limited to, polyol reduction using ethylene glycol as a reducing agent. By way of examples, solvents for the reduction reaction may include, but are not limited to, hexane and ethylene glycol. Solutions containing the above coordinating ligands may also be used as a solvent.

The one or more conductive nanostructures 104 may be further formed by removing the coordinating ligands after the reaction of metal halide and a coordinating ligand by methods, such as, but not limited to, chemical washing, heating, and treatment with chemical agents that precipitate and remove the coordinating ligands.

Referring back to FIG. 1D, the one or more second microdomains 102 may be removed, while leaving the one or more conductive nanostructures 104. The one or more second microdomains 102 may be removed by methods such as, but not limited to, chemical treatment, UV radiation, $O_3$ treatment, plasma treatment, and a combination thereof.

Figure 6:
FIG. 6 depicts various illustrative embodiments of conductive nanostructures having different shapes.
Figure 6:
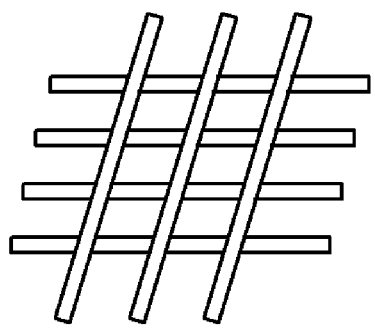
Figure 6:
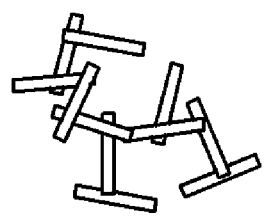

FIG. 6 depicts various illustrative embodiments of conductive nanostructures having different shapes. In certain embodiments, the one or more conductive nanostructures 104 prepared by the above methods of the present disclosure may be in the shape of a wire, mesh, aggregated particles and a combination thereof, but are not limited thereto.

In some embodiments, the one or more conductive nanostructures prepared by the above methods of the present disclosure may have diameter dimensions corresponding to or smaller than the width/pitch of one of the microdomains of the block copolymer. Nanoscale conductive structures with good electrical connectivity are prepared by utilizing self-assembling block copolymers that phase separate into nanometer-scale microdomains.

Figure 7A:
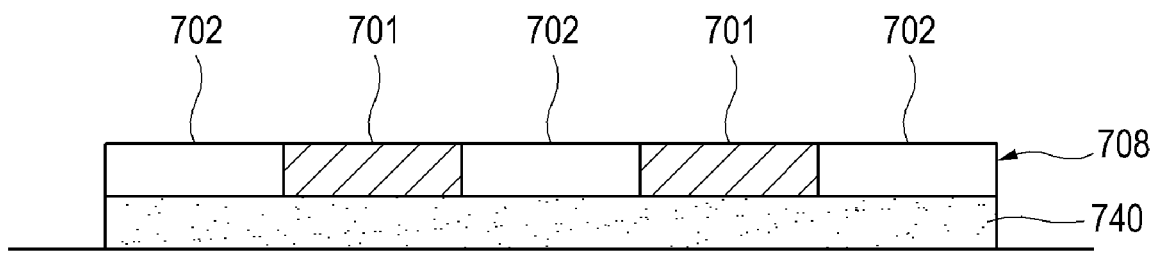
FIGS. 7A-7D are schematic diagrams showing another illustrative embodiment of a method for preparing conductive nanostructures.
Figure 7B:
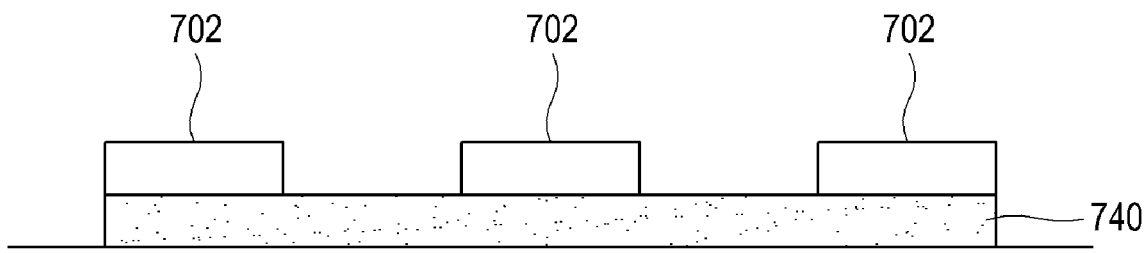
Figure 7C:
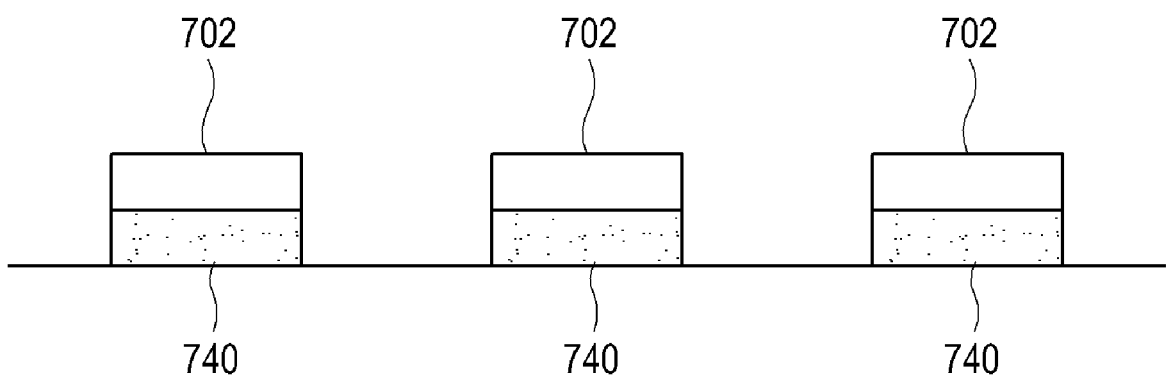
Figure 7D:
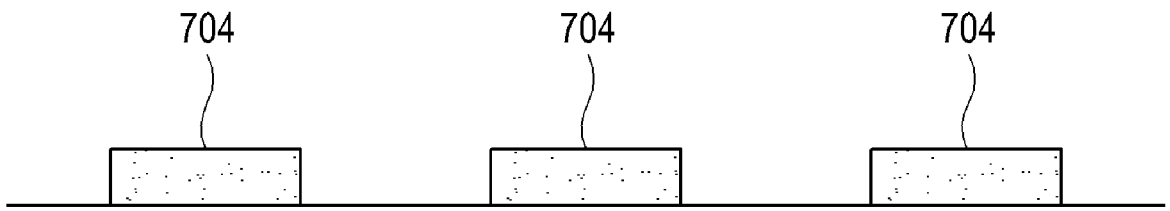

FIGS. 7A-7D are schematic diagrams showing another illustrative embodiment of a method for preparing conductive nanostructures. Referring to FIG. 7A, a conductive layer 740 coated with a block copolymer 708 may be prepared. The block copolymer 708 may include one or more first microdomains 701 and one or more second microdomains 702. Next, as illustrated in FIG. 7B, the one or more first microdomains 701 of the block copolymer 708 may be removed under conditions effective to expose parts of the conductive layer 740. Referring to FIG. 7C, the exposed parts of the conductive layer 740 may be etched by methods such as, but not limited to, wet etching, plasma etching, ion beam etching, and a combination thereof. Referring to FIG. 7D, the one or more second microdomains 702 may be removed to prepare conductive nanostructures 704.

Figure 8A:
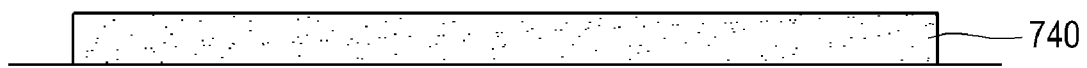
FIGS. 8A-8F are schematic diagrams showing another illustrative embodiment of a method for preparing conductive nanostructures.
Figure 8B:
Figure 8C:
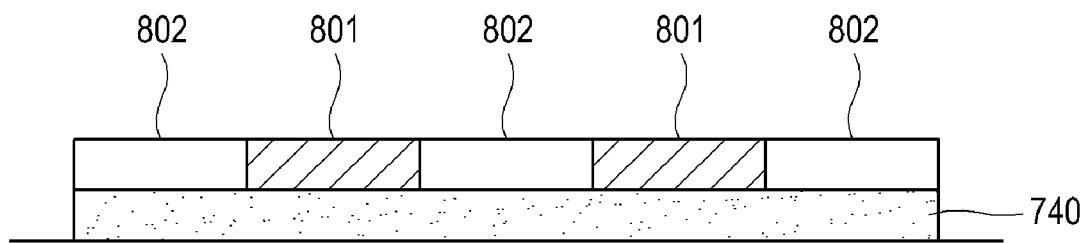
Figure 8D:
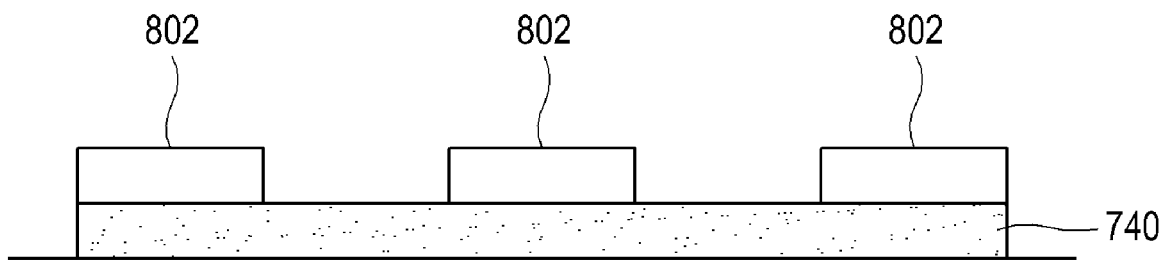
Figure 8E:
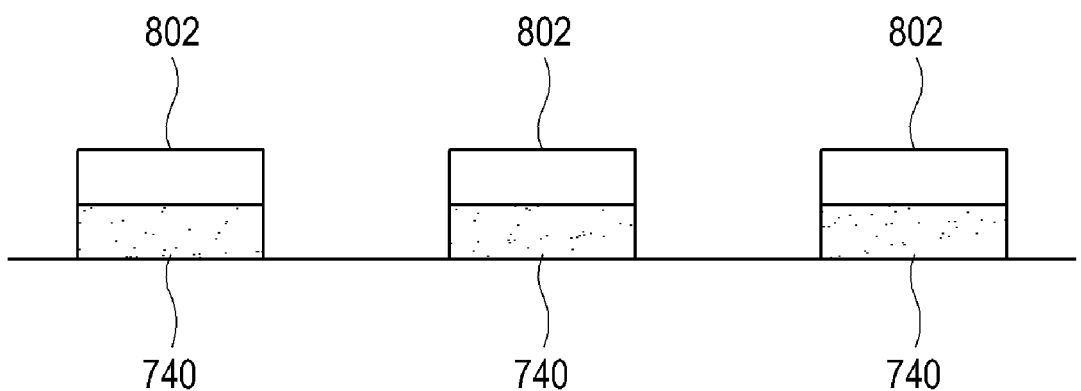
Figure 8F:
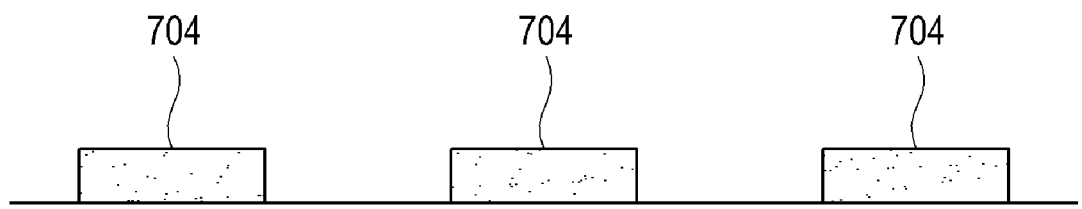

FIGS. 8A-8F are schematic diagrams showing another illustrative embodiment of a method for preparing conductive nanostructures. The method illustrated in FIGS. 8A-8F is substantially similar to that illustrated in FIGS. 7A-7D except that the block copolymer 808 in FIGS. 8A-8F is induced to self-assemble after being coated on the conductive layer 740, while the block copolymer 708 in FIGS. 7A-7D is already self-assembled before being coated on the conductive layer 740. The conductive layer coated with a block copolymer may be prepared by first providing a conductive layer 740, as illustrated in FIG. 8A. Then, a block copolymer 808 may be applied on the conductive layer 740, as illustrated in FIG. 8B. The block copolymer 808 on the conductive layer 740 may be applied by methods such as, but not limited to, spin coating, solvent casting, and a polydimethylsiloxane (PDMS) stamp. Referring to FIG. 8C, the self assembly of the block copolymer 808 into one or more first microdomains 801 and one or more second microdomains 802 may be induced. The one or more first microdomains 801 may be removed to expose parts of the conductive layer 740, as illustrated in FIG. 8D. Referring to FIG. 8E, the exposed parts of the conductive layer 840 may be etched by methods as described above with respect to FIG. 7C. As illustrated in FIG. 8F, the one or more second microdomains 802 may be removed to prepare one or more conductive nanostructures 704.

Descriptions regarding the block copolymers 708, 808 illustrated in FIGS. 7A-7D and 8A-8F, respectively, have already been described and illustrated in FIGS. 2A-2B, and are not repeated herein in their entirety. In FIGS. 7A-7D and 8A-8F, the block copolymers 708, 808 may have one or more first microdomains 701, 801 and one or more second microdomains 702, 802, respectively, configured in a variety of predetermined patterns, as already described above.

Figure 9A:
FIGS. 9A-9F are schematic diagrams showing still another illustrative embodiment of a method for preparing conductive nanostructures.
Figure 9B:
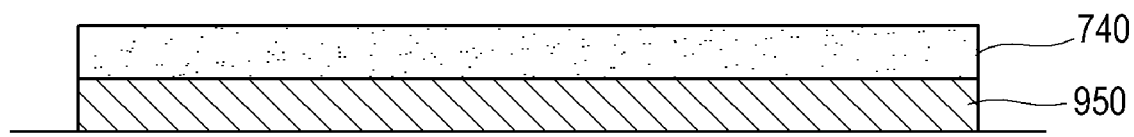
Figure 9C:
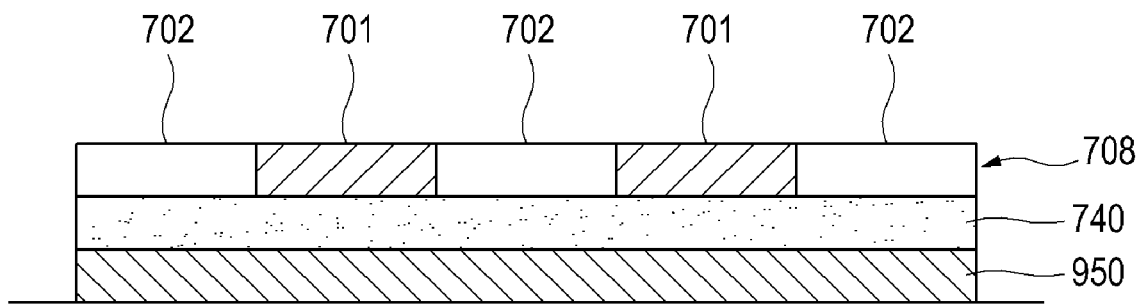
Figure 9D:
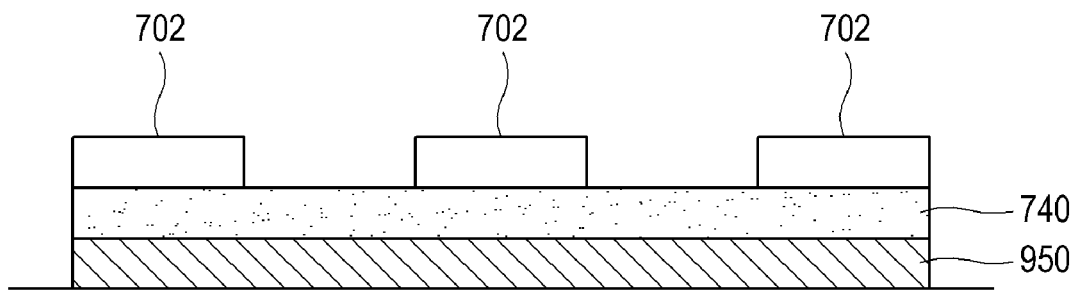
Figure 9E:
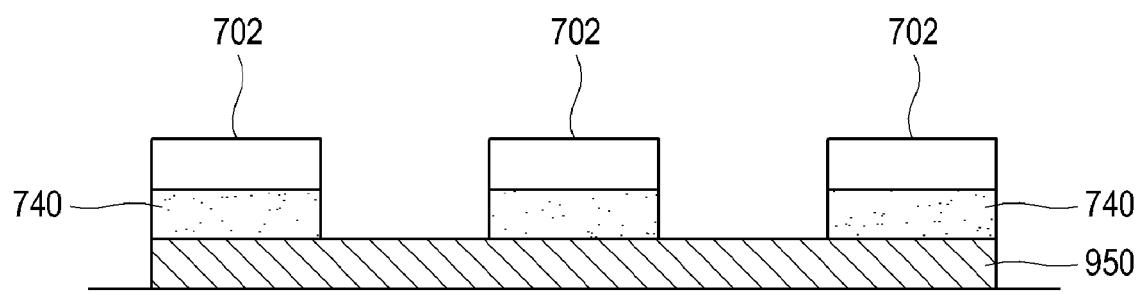
Figure 9F:
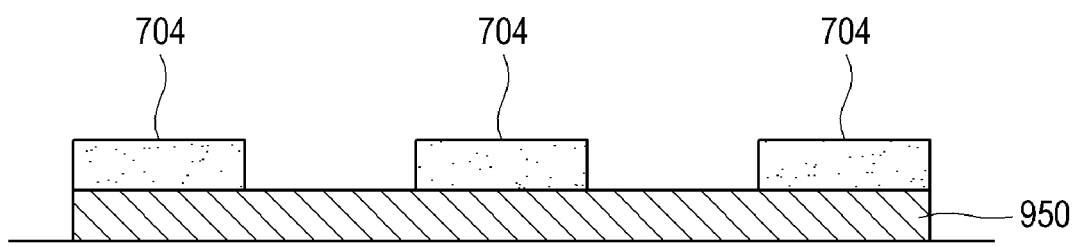

FIGS. 9A-9F are schematic diagrams showing still another illustrative embodiment of a method for preparing conductive nanostructures. The method illustrated in FIGS. 9A-9F is substantially similar to that illustrated in FIGS. 7A-7D except that the conductive layer 740 is deposited on a first substrate 950, prior to the applying the block copolymer 708 as shown in FIGS. 9A-9B. The first substrate 950 may be made of a variety of materials, as already described above. Next, referring to FIG. 9C, a block copolymer 708 may be applied on the conductive layer 740 by methods as already described above with respect to FIG. 8B, and the block copolymer 708 may be induced to self assemble into one or more first microdomains 701 and one or more second microdomains 702. As illustrated in FIG. 9D, the one or more first microdomains 701 may be removed under conditions effective to expose parts of the conductive layer 740. As depicted in FIG. 9E, the exposed parts of the conductive layer 740 may be etched. Referring to FIG. 9F, the one or more second microdomains 702 may be removed under conditions effective to prepare one or more conductive nanostructures 704.

Figure 10A:
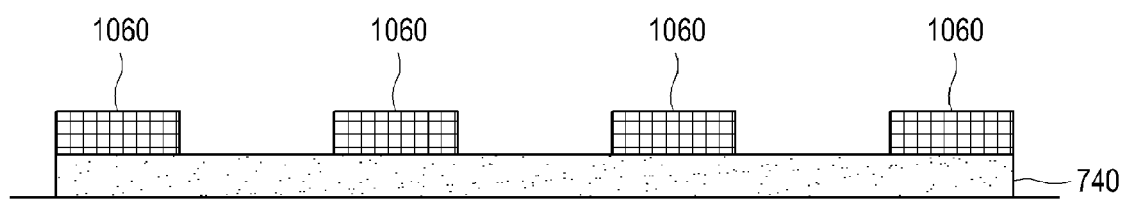
FIGS. 10A-10F are schematic diagrams showing another illustrative embodiment of a method for preparing conductive nanostructures.
Figure 10B:
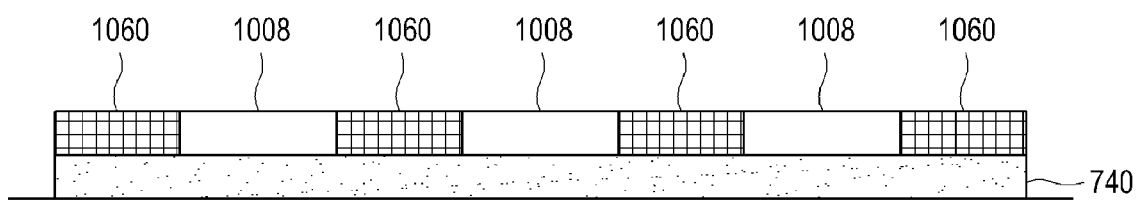
Figure 10C:
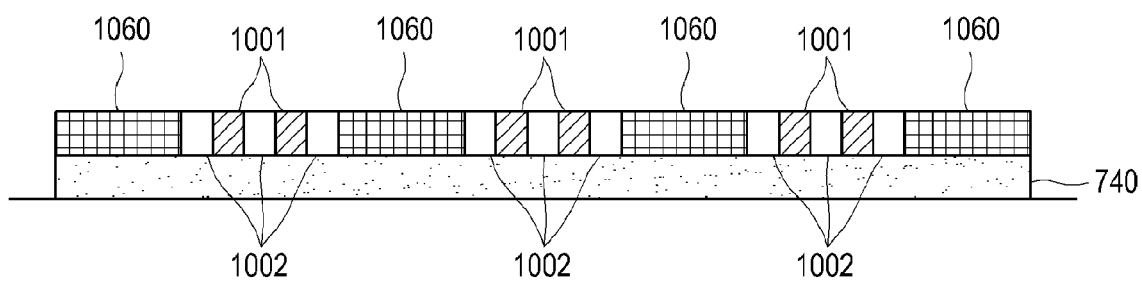
Figure 10D:
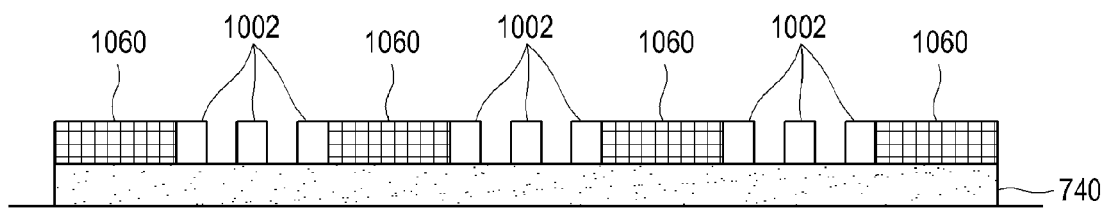
Figure 10E:
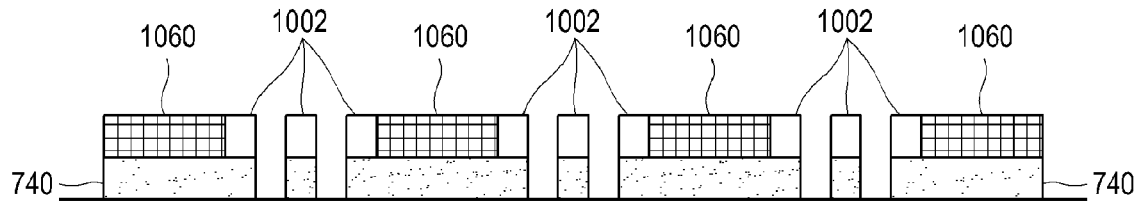
Figure 10F:
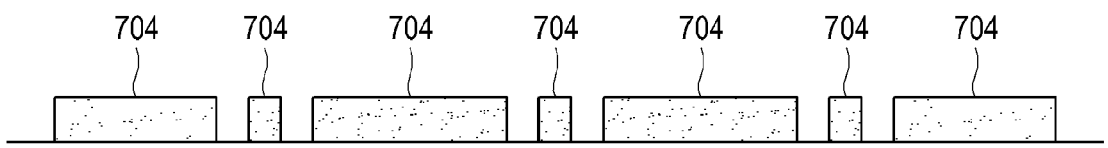

FIGS. 10A-10F are schematic diagrams showing another illustrative embodiment of a method for preparing conductive nanostructures. The method illustrated in FIGS. 10A-10F is substantially similar to that illustrated in FIGS. 8A-8F except that a patterned layer 1060 is prepared on a conductive layer 740 as shown in FIG. 10A-B. The patterned layer may be prepared on a conductive layer by methods such as, but not limited to, microcontact printing and photolithography. Next, a block copolymer 1008 may be applied on the conductive layer 740, using the patterned layer 1060 as a framework to direct the block copolymer 1008 to be applied in the space in between, as illustrated in FIG. 10B. Referring to FIG. 10C, self assembly of the block copolymer 1008 into one or more first microdomains 1001 and one or more second microdomains 1002 may be induced. As illustrated in FIG. 10D, the one or more first microdomains 1001 may be removed under conditions effective to expose parts of the conductive layer 740. Referring to FIG. 10E, the exposed parts of the conductive layer 740 may be etched. As illustrated in FIG. 10F, the one or more second microdomains 1002 and the patterned layer 1060 may be removed under conditions effective to prepare one or more conductive nanostructures 704. In some embodiments, the patterned layer 1060 may be removed simultaneously with the etching of the one or more second microdomains 1002, as illustrated in FIG. 10F. In other embodiments, the patterned layer 1060 may be removed after or before the etching the one or more second microdomains 1002.

Descriptions regarding the various conditions and methods illustrated in FIGS. 7A-7D, 8A-8F, 9A-9F, and 10A-10F, the conditions for inducing self-assembly of the block copolymer 708, 808, 1008 and methods for removing the one or more first microdomains 701, 801, 1001 and second microdomains 702, 802, 1002 for example, have already been described above with respect to FIGS. 1A-1D and 2A-2B, and are not repeated herein in their entirety.

The one or more conductive nanostructures prepared by any methods of the present disclosure may optionally be transferred from a first substrate to a second substrate by using methods such as, but not limited to a polydimethylsiloxane (PDMS) stamp. For example, the one or more conductive nanostructures 704 illustrated in FIG. 9F may be transferred from the first substrate 950 to a second substrate (not shown). The second substrate may be made of any material including the materials already described above, since it does not have to endure the above described chemical/physical treatments for preparing the one or more conductive nanostructures of the present disclosure. For example, even materials which are sensitive to chemical and/or plasma treatment used in the above-described methods for preparing the one or more conductive nanostructures may be used for the second substrate. In addition, any material having chemical/physical properties that are vulnerable to conditions effective to induce self-assembly of the block copolymer may be used for the second substrate.

The second substrate may have, without limitation, a thickness of from about 0.1 μm to about 5 cm. In some embodiments, the thickness of the transparent substrate 101 may range from about 1 μm to about 5 cm, from about 5 μm to about 5 cm, from about 10 μm to about 5 cm, from about 50 μm to about 5 cm, from about 100 μm to about 5 cm, from about 500 μm to about 5 cm, from about 1 cm to about 5 cm, from about 2 cm to about 5 cm, from about 0.1 μm to about 1 μm, from about 0.1 μm to about 5 μm, from about 0.1 μm to about 10 μm, from about 0.1 μm to about 50 μm, from about 0.1 μm to about 100 μm, from about 0.1 μm to about 500 μm, from about 0.1 μm to about 1 cm, from about 0.1 μm to 2 cm, from about 1 μm to about 5 μm, from about 5 μm to about 10 μm, from about 10 μm to about 50 μm, from about 50 μm to about 100 μm, from about 100 μm to about 500 μm, from about 500 μm to about 1 cm, or from about 1 cm to about 2 cm. In other embodiments, the thickness of the transparent substrate 101 may be about 0.1 μm, about 1 μm, about 5 μm, about 10 μm, about 50 μm, about 100 μm, about 500 μm, about 1 cm, about 2 cm, or about 5 cm.

Electronic circuits and electronic devices containing the conductive nanostructures manufactured according to the above methods of the present disclosure have various applications, such as transparent display units, windows with heating elements, and optical devices.

EXAMPLES

The following examples are provided for illustration of some of the illustrative embodiments of the present disclosure but are by no means intended to limit their scope.

Example 1

Preparation of Conductive Nanostructures Using a Composite of Nanoparticles and Block Copolymer A polystyrene-b-poly(n-hexyl methacrylate) diblock copolymer (PS-b-PHMA) is synthesized by living anionic polymerization, where the blocks of the copolymer have molecular weights of 23 and 67 kg/mol, respectively. The copolymer has a self-assembled structure of cylindrical domains of polystyrene (PS) distributed in a poly(n-hexyl methacrylate) (PHMA) matrix. The PS cylindrical domains have a diameter of 18 nm and a periodicity (i.e., thickness) of 34.5 nm. Then, 10 nm silver nanoparticles are added to the copolymer. The copolymer containing the silver nanoparticles is spin coated on a $SiO_2$ wafer having a thickness of 30 nm. The copolymer coated on the $SiO_2$ wafer is kept for 5 hours at 120° C. to induce the selective distribution of the silver nanoparticles in the PHMA matrix. The selective distribution of the added silver nanoparticles into the PHMA matrix is confirmed by TEM images. Next, $CHF_3/O_2$ plasma is used to selectively remove the PHMA matrix. Since the etching rate with respect to the PHMA matrix is 2.5 times faster than that with respect to the PS domains, the PHMA matrix is selectively removed, leaving the silver nanoparticles. A mixture of 20 mM AuCl and 0.4 M oleylamine in hexane is added into the spaces between the PS domains where silver nanoparticles are distributed, and the wafer is heated to 60° C. to induce the reaction of AuCl, oleylamine and silver nanoparticles, where the mole ratio of Au/Ag is 200:1. After 12 hours, oleylamine is removed by alcohol washing and the PS domains are removed using a conventional stripping solution, where Au nanowires grown on silver nanoparticles are obtained.

Example 2

Preparation of Conductive Nanostructures Using Block Copolymer and Lithography Technique The polystyrene-b-poly(n-hexyl methacrylate) diblock copolymer (PS-b-PHMA) synthesized in Example 1 above is used to coat a conductive layer of gold having a thickness of 30 nm. The copolymer has a self-assembled structure of cylindrical domains of PS distributed in a PHMA matrix. Next, $CHF_3/O_2$ plasma is used to selectively remove the PHMA matrix. The exposed parts of the conductive layer are etched by ion beam etching. Then, PS domains are removed using a conventional stripper solution to obtain the conductive nanostructures.

Example 3

Preparation of Conductive Nanostructures Utilizing a Patterned Layer

A layer having a striped pattern with 300 nm intervals is formed on a conductive layer of gold by a conventional lithography technique. Next, the polystyrene-b-poly(n-hexyl methacrylate) diblock copolymer (PS-b-PHMA) synthesized in Example 1 above is used to fill the gaps between the stripes of the patterned layer on the conductive layer. The copolymer has a self-assembled structure of cylindrical domains of PS distributed in a PHMA matrix. Then, $CHF_3/O_2$ plasma is used to selectively remove the PHMA matrix. The exposed parts of the conductive layer are etched by ion beam etching. Finally, the PS domains are removed using a conventional stripper solution to obtain the conductive nanostructures.

The above prepared conductive nanostructures may be pressed onto a PDMS stamp and then transferred onto a transparent glass substrate, where the transferred conductive nanostructures are invisible to naked eyes and the glass substrate containing the conductive nanostructures looks transparent.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, will be apparent. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having"

should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A method for preparing one or more conductive nanostructures comprising:
providing a composite of nanoparticles and block copolymer, the composite comprising first microdomains and second microdomains, wherein one or more conductive nanoparticles are selectively distributed in the first microdomains;
selectively removing the first microdomains, while leaving the conductive nanoparticles in the composite;
selectively forming one or more conductive nanostructures on the conductive nanoparticles after removal of the first microdomains; and
selectively removing the second microdomains after forming one or more conductive nanostructures on the conductive nanoparticles.

2. The method of claim 1, wherein the first and second microdomains of the composite are configured in a predetermined pattern.

3. The method of claim 1, wherein the providing a composite comprises:
mixing the conductive nanoparticles and the block copolymer; and
inducing self-assembly of the block copolymer into the first microdomains and the second microdomains.

4. The method of claim 1, wherein the block copolymer is one or more of polystyrene-b-poly(2-vinylpyridine) (PS-b-P2VP), polystyrene-b-polydimethylsiloxane (PS-b-PDMS), polystyrene-b-poly(methyl methacrylate) (PS-b-PMMA), polystyrene-b-poly(n-hexyl methacrylate) (PS-b-PHMA), polystyrene-b-polyimide (PS-b-PI), polystyrene-b-polybutadiene (PS-b-PB), polystyrene-b-polybutadiene-b-polystyrene (PS-b-PB-b-PS), polystyrene-b-polyimide-b-polystyrene (PS-b-PI-b-PS), poly(methyltetracyclododecene)-b-poly(substituted-2-norbornene) (PMTCDD-b-P2NB), or lysine-b-cysteine.

5. The method of claim 1, wherein the conductive nanoparticles comprise a metal, a metal-coated inorganic material or a metal-coated polymer.

6. The method of claim 3, wherein the inducing self-assembly of the block copolymer comprises heating, UV radiation, or application of an electrical field.

7. The method of claim 1, wherein the removing the first microdomains is carried out by chemical treatment, UV radiation, $O_3$ treatment, plasma treatment, or a combination thereof.

8. The method of claim 1, wherein the forming one or more conductive nanostructures comprises reacting metal halide and a coordinating ligand under conditions effective to form organometallic complexes.

9. The method of claim 8, wherein the metal halide is a halide salt of a noble metal selected from the group consisting of Au, Pt, Pd, Ni, and Ag.

10. The method of claim 8, wherein the coordinating ligand is an alkylamine, alkylcyanide, or alkylphosphine.

11. The method of claim 8, wherein the forming one or more conductive nanostructures comprises subjecting the organometallic complexes under conditions effective to convert metal ions in the organometallic complexes to metal atoms.

12. The method of claim 1, wherein the removing the second microdomains is carried out by chemical treatment, UV radiation, $O_3$ treatment, plasma treatment or a combination thereof.

13. The method of claim 1, wherein the providing a composite comprises:
    providing a block copolymer;
    inducing self-assembly of the block copolymer into the first microdomains and the second microdomains; and
    adding the conductive nanoparticles to the self-assembled block copolymer to selectively distribute the conductive nanoparticles in the first microdomains.

14. A method for preparing one or more conductive nanostructures comprising:
    preparing a conductive layer coated with a block copolymer, wherein the block copolymer comprises first microdomains and second microdomains;
    selectively removing the first microdomains of the block copolymer under conditions effective to selectively expose parts of the conductive layer;
    etching the exposed parts of the conductive layer after selectively removing the first microdomains; and
    removing the second microdomains under conditions effective to prepare one or more conductive nanostructures after etching the exposed parts of the conductive layer.

15. The method of claim 14, wherein the preparing a conductive layer coated with a block copolymer comprises:
    applying the block copolymer on the conductive layer; and
    inducing self assembly of the block copolymer into the first microdomains and the second microdomains.

16. The method of claim 15, wherein the inducing self-assembly of the block copolymer comprises heating, UV radiation, or application of an electrical field.

17. The method of claim 15, further comprising:
    preparing a patterned layer on the conductive layer, prior to the applying.

18. The method of claim 17, wherein the preparing a patterned layer is carried out by microcontact printing or photolithography.

19. The method of claim 17, further comprising:
    removing the patterned layer, simultaneously, after, or before the etching.

20. The method of claim 15, wherein the applying the block copolymer is carried out by spin coating, solvent casting, or a polydimethylsiloxane (PDMS) stamp.

21. The method of claim 1, wherein a distribution and/or a shape of the one or more conductive nanostructures is determined by at least one a relative distribution of the first and second microdomains in the block copolymer or a distribution of the conductive nanoparticles in the first microdomain.

22. The method of claim 1, wherein the forming of the one or more conductive nanostructures is regulated at least in part by the second microdomains.

23. The method of claim 22, wherein the second microdomains act as a framework to direct the formation of the one or more conductive nanostructures within a space between the second microdomains.

24. The method of claim 23, wherein the one or more conductive nanostructures are formed in a substantially uniform direction within the space between the second microdomains.

25. The method of claim 14, wherein a distribution and/or a shape of the one or more conductive nanostructures is determined by a relative distribution of the first and second microdomains in the block copolymer.

* * * * *

UNITED STATES PATENT AND TRADEMARK OFFICE
CERTIFICATE OF CORRECTION

| | | |
|---|---|---|
| PATENT NO. | : 8,202,436 B2 | Page 1 of 1 |
| APPLICATION NO. | : 12/642556 | |
| DATED | : June 19, 2012 | |
| INVENTOR(S) | : Lee | |

It is certified that error appears in the above-identified patent and that said Letters Patent is hereby corrected as shown below:

On the Title Page, in Field (56), under "OTHER PUBLICATIONS", in Column 2, Lines 1-2, delete "Glass, R. et al.—"Block Copolymer ............ pp. 1153-1160.".

On the Title Page, in Field (56), under "OTHER PUBLICATIONS", in Column 2, Line 20, delete "Blycolaldehyde" and insert -- Glycolaldehyde --, therefor.

On the Title Page, in Field (56), under "OTHER PUBLICATIONS", in Column 2, Line 21, delete "vol.xx, No.xx, XXXX," and insert -- vol. 8, No. 7, 2008, --, therefor.

On Title Page 2, in Field (56), under "OTHER PUBLICATIONS", in Column 2, Line 3, delete "alligned" and insert -- aligned --, therefor.

On Title Page 2, in Field (56), under "OTHER PUBLICATIONS", in Column 2, Line 6, delete "Feb, 2002," and insert -- Feb. 22, 2002, --, therefor.

In Column 6, Line 29, delete "Au Cl" and insert -- AuCl --, therefor.

In Column 6, Line 45, delete "nano structures." and insert -- nanostructures. --, therefor.

Signed and Sealed this
Sixteenth Day of October, 2012

David J. Kappos
*Director of the United States Patent and Trademark Office*